(12) United States Patent
Marie (10) Patent No.: US 8,330,630 B2
(45) Date of Patent: Dec. 11, 2012

(54) PHASE FREQUENCY TO DIGITAL CONVERTER

(75) Inventor: Herve Marie, Caen (FR)

(73) Assignee: NXP, N.V., Eindhoven (NL)

( * ) Notice: Subject to any disclaimer, the term of this patent is extended or adjusted under 35 U.S.C. 154(b) by 76 days.

(21) Appl. No.: 13/122,753

(22) PCT Filed: Sep. 25, 2009

(86) PCT No.: PCT/IB2009/054211
§ 371 (c)(1),
(2), (4) Date: Apr. 6, 2011

(87) PCT Pub. No.: WO2010/041163
PCT Pub. Date: Apr. 15, 2010

(65) Prior Publication Data
US 2011/0193599 A1    Aug. 11, 2011

(30) Foreign Application Priority Data

Oct. 8, 2008  (EP) .................................... 08290948

(51) Int. Cl.
*H03M 1/48*  (2006.01)
(52) U.S. Cl. ........................ 341/111; 375/376
(58) Field of Classification Search ............ 341/111; 375/376, 354, 371, 373; 327/141; 370/503
See application file for complete search history.

(56) References Cited

U.S. PATENT DOCUMENTS

| 6,384,654 | B1 | 5/2002 | Noufer |
| 7,706,496 | B2 * | 4/2010 | Youssoufian ................. 375/376 |
| 2006/0171495 | A1 | 8/2006 | Youssouflan |
| 2007/0075785 | A1 | 4/2007 | Kossel et al. |

OTHER PUBLICATIONS

Rahkonen, T., et al. "Pulsewidth Measurements Using an Integrated Pulse Shrinking Delay Line", Proc. of the Intl. Symp. on Circuits and Systems (IEEE), vol. 1 No. 4, pp. 578-581 (May 1990).
Mansuri, M., et al. "Fast Frequency Acquisition Phase-Frequency Detectors for GSa/s Phase-Locked Loops", Solid State Circuit Conference, ESSIRC (2001).

(Continued)

*Primary Examiner* — Joseph Lauture
(74) *Attorney, Agent, or Firm* — Kramer & Amado P.C.

(57) ABSTRACT

A circuit arrangement is described comprising a first receiver configured to receive a first input signal, a second receiver configured to receive a second input signal, a first signal generator configured to generate a first pulse signal, a second signal generator configured to generate a second pulse signal, wherein a delay between a rising edge of the first pulse signal and a rising edge of the second pulse signal is proportional to a difference between the first input signal and the second input signal, a first converter configured to convert the first pulse signal to a first digital number proportional to a width of the first pulse signal, a second converter configured to convert the second pulse signal to a second digital number proportional to a width of the second pulse signal, wherein at least one of the first converter and the second converter comprises a cascade of at least two converter stages, wherein each converter stage of the at least two converter stages is configured to propagate and shrink the respective pulse signal. Also a corresponding method is described.

14 Claims, 7 Drawing Sheets

OTHER PUBLICATIONS

Mansuri, M., et al. "Fast Frequency Acquisition Phase-Frequency Detectors for GSa/s Phase-Locked Loops", IEEE J. of Solid-State Circuits, vol. 37, No. 10, pp. 1331-1334 (Oct. 2002).

Kalisz, J., et al. "Review of Methods for Time Interval Measurements with Picosecond Resolution", Metrologia 41, Inst. Of Physics Publishing, pp. 17-32 (Feb. 2004).

Staszewski, R. et al. "Phase-Domain All-Digital Phase-Locked Loop," IEEE Trans. on Circuits & Systems-II: Express Briefs, vol. 52, No. 3, pp. 159-163 (Mar. 2005).

Staszewski, R. et al. "A Digitally Controlled Oscillator in a 90 nm Digital CMOS Process for Mobile Phones", IEEE J. of Solid-State Circuits, vol. 40, No. 11, pp. 2203-2211 (Nov. 2005).

International Search Report and Written Opinion for In'tl. Patent Application No. PCT/IB2009/054211 (May 20, 2010).

* cited by examiner

PHASE FREQUENCY TO DIGITAL CONVERTER

TECHNICAL FIELD

A method and a circuit arrangement relating to the conversion of a phase frequency to a digital number is described.

BACKGROUND OF THE INVENTION

Synthesizer circuits are common sub-blocks of many data-communication systems. A common aim is the generation of a signal that has a fixed relation to the phase of a reference signal. This aim is achieved by a phase-locked loop for example, which is found in many circuits, including integrated circuits (ICs). A synthesizer circuit like a phase-locked loop circuit may be designed based on different kinds of implementations. Generally a phase or frequency difference is converted to a signal. For convenient processing, the generated signal may be a digital signal. Thus the circuit arrangement which is to convert the phase or frequency difference to a digital signal is an important component of many such synthesizer circuits. Noise in the generated signal is problematic. Furthermore, an implementation of a phase-locked based on analog circuitry poses challenges in the design and manufacture process for digital circuits, in particular for integrated digital circuits. Another concern especially in ICs is the reduction of power consumption.

Published United States Patent Application US 2006/0171495 discloses a digital phase detector for a phase locked loop. However US 2006/0171495 lacks an implementation suitable for convenient integration into an IC and for reducing power consumption. It is an object to provide a phase frequency to digital converter architecture which can be easily integrated into the design and manufacture process for an IC and which is suitable for reducing energy consumption. It is a further object to provide a phase frequency to digital converter architecture with short reaction times and which can take advantage of future miniaturization advances in CMOS technology. An additional object is to reduce energy consumption in particular for the situation that the phase error in a phase locked loop is small. Moreover an object is to prevent an occurrence of undefined states when the phase error is below a lower threshold region.

SUMMARY OF THE INVENTION

According to one aspect of the invention, there is disclosed a circuit arrangement comprising a first receiver configured to receive a first input signal, a second receiver configured to receive a second input signal, a first signal generator configured to generate a first pulse signal, a second signal generator configured to generate a second pulse signal, wherein a delay between a rising edge of the first pulse signal and a rising edge of the second pulse signal is proportional to a difference between the first input signal and the second input signal, a first converter configured to convert the first pulse signal to a first digital number proportional to a width of the first pulse, a second converter configured to convert the second pulse signal to a second digital number proportional to a width of the second pulse signal, wherein at least one of the first converter and the second converter comprises a cascade of at least two converter stages, wherein each converter stage of the at least two converter stages is configured to propagate and shrink the respective pulse signal.

The first input signal, the second input signal, the first pulse signal and the second pulse signal may be electrical signals.

The first pulse signal and the second pulse signal may be rectangular electrical signals. The width of the first pulse signal may be the time between a rising edge of the first pulse signal and the falling edge of the first pulse signal. The first digital number may be represented by a binary coding of a number of parallel electrical signal lines. Propagating a signal may comprise receiving a signal and generating the signal after a time delay. Propagating and shrinking a respective pulse signal may comprise propagating the respective pulse signal and reducing the width of the respective propagated pulse signal. Successively propagating and shrinking a respective pulse signal may comprise reducing the width of the respective propagated pulse signal by the same time difference for each propagation.

According to another aspect of the invention, there is disclosed a method comprising receiving a first input signal, receiving a second input signal, generating a first pulse signal, generating a second pulse signal, wherein a delay between a rising edge of the first pulse signal and a rising edge of the second pulse signal is proportional to a difference between the first input signal and the second input signal, converting the first pulse signal to a first digital number proportional to a width of the first pulse signal, and converting the second pulse signal to a second digital number proportional to a width of the second pulse signal, wherein converting the at least one of the first pulse signal and the second pulse signal to a respective digital number comprises successively propagating and shrinking the respective pulse signal.

The described method and the described circuit arrangement have the technical effect that propagating and shrinking the respective pulse signal can be implemented with basic digital circuit building elements and that the power consumption is reduced with a reduction of the difference in phase and frequency between the first input signal and the second input signal.

The circuit arrangement may be a block of an IC. The circuit arrangement may be a block of a complementary metal-oxide-semiconductor (CMOS) IC. An output signal line of a first converter stage of the at least two converter stages may be connected to an input signal line of a second converter stage of the at least two converter stages.

In an embodiment the delay between a rising edge of the first pulse signal and a rising edge of the second pulse signal is proportional to at least one of a phase difference and a frequency difference between the first input signal and the second input signal. This may have the technical effect of generating a pulse-width modulated first pulse signal whose width depends on the phase difference between the first input signal and the second input signal. The phase difference or the frequency difference between the first input signal and the second input signal may be a time delay between a rising edge of the first input signal and a rising edge of the second input signal.

Propagating and shrinking the first pulse signal comprises propagating an input pulse signal after a propagation delay, detecting a propagated pulse signal, and generating a pulse detection signal when the propagated pulse signal is detected, which pulse detection signal is indicative of the respective digital number according to an embodiment. This may have the technical effect of not requiring switching for a pulse detection signal for which no propagated pulse signal is detected. The generated signal may be further processed with other pulse detection signals to generate a binary coding of the respective digital number. The binary coding of the respective digital number may be signalled on a number of parallel electrical signal lines.

In an embodiment propagating the input pulse signal after a propagation delay comprises propagating an input pulse signal with a falling edge after a first propagation delay, and propagating an input pulse signal with a rising edge after a second propagation delay, wherein the first propagation delay is shorter than the second propagation delay. This may have the technical effect of reducing the pulse width of a propagated signal by a constant width for each propagation stage. Propagating an input pulse signal with a falling edge may comprise propagating the falling edge of a rectangular input pulse signal. Propagating an input pulse signal with a rising edge may comprise propagating the rising edge of a rectangular input pulse signal. The propagation delay of an input pulse signal with a falling edge may be the time between the falling edge of the input pulse signal and the falling edge of the propagated signal. The propagation delay of an input pulse signal with a rising edge may be the time between the rising edge of the input pulse signal and the rising edge of the propagated signal.

Propagating the input pulse signal with a falling edge comprises switching on a first at least one transistor, propagating the input pulse signal with a rising edge comprises switching on a second at least one transistor of the same type as the first at least one transistor, wherein the aspect ratio of the first at least one transistor is greater than the aspect ratio of the second at least one transistor according to an embodiment. This may have the technical effect of implementing a different propagation delay for an input pulse signal with a rising edge and for an input pulse signal with a falling edge without increasing the number of transistors. The at least one transistor may be a transistor of any semiconductor material, of any material and of any polarity. In particular, the at least one transistor may be a n-channel metal-oxide-semiconductor field-effect transistor (MOSFET). The at least one transistor may also be a p-channel MOSFET. The first at least one transistor may be a p-type transistor. The first at least one transistor may also be an n-type transistor. The aspect ratio of a transistor may be the ratio of a width of a channel region of the transistor to a length of a channel region of the transistor. Switching on a transistor may comprise creating a conductive connection between two gates of the transistor.

In an embodiment propagating the input pulse signal with a falling edge comprises generating at least one feed-forward signal, which generating at least one feed-forward signal comprises successively switching a first number of transistors, wherein propagating the input pulse signal with a rising edge comprises successively switching a second number of transistors, and wherein the first number of transistors is less than the second number of transistors. This may have the technical effect that the at least one feed-forward signal may be generated with a smaller propagation delay after an input pulse signal with a falling edge than the propagation delay after an input pulse signal with a rising edge. The at least one feed-forward signal may be a signal predictive of an input pulse signal with a falling edge. Successively switching a number of transistors may comprise switching a first of the number of transistors and switching a second of the number of transistors after having switched the first of the number of transistors.

Propagating the input pulse signal comprises receiving a propagated signal and receiving at least one feed-forward signal according to an embodiment. This may have the technical effect that the input pulse signal may be propagated with a smaller propagation delay than if the input pulse signal were propagated on the basis of a received propagated signal only.

In an embodiment detecting a propagated pulse signal and generating a pulse detection signal when the propagated pulse signal is detected comprises resetting a latch and switching the latch to a state indicative of a detected pulse when the propagated pulse signal is detected. This may have the technical effect of storing the value of the propagated pulse signal in a manner that can be implemented in an energy-efficient manner using standard CMOS circuit elements. A latch may be a set reset flip-flop. A latch may be implemented in a CMOS IC.

Detecting a propagated pulse signal and generating a pulse detection signal when the propagated pulse signal is detected comprises keeping the state of the latch when the propagated pulse signal is not detected after resetting the latch according to an embodiment. This may have the technical effect of only consuming energy if a propagated pulse signal is detected. Keeping the state of the latch when the propagated signal is not detected may comprise not switching the latch.

In an embodiment generating the first pulse signal and generating the second pulse signal comprises generating the first pulse signal when a rising edge of the first input signal is received, generating the second pulse signal when a rising edge of the second input signal is received, and resetting the first pulse signal and resetting the second pulse signal after a delay after having generated the first pulse signal and having generated the second pulse signal. This may have the technical effect of providing an implementation of generating a pulse-width modulated signal indicative of a phase difference that is suitable for integration into a CMOS IC. The delay before resetting the first pulse signal and resetting the second pulse signal may be the propagation delay of a logic gate. In particular, the delay before resetting the first pulse signal and resetting the second pulse signal may be the propagation delay of an AND gate.

The described method may comprise converting the second pulse signal to a second digital number proportional to a width of the second pulse signal and subtracting the second digital number from the first digital number to generate a third digital number according to an embodiment. The circuit arrangement may comprise a converter configured to convert the second pulse signal to a second digital number proportional to a width of the second pulse signal and an adder configured to subtract the second digital number from the first digital number to generate a third digital number in an embodiment. This may have the technical effect of providing a digital number representation of a phase difference between the first input pulse signal and the second input pulse signal. Subtracting the second digital number from the first digital number may comprise generating the negative of the second digital number and adding that negative of the second digital number to the first digital number.

The described method may comprise converting the second pulse signal to a second digital number proportional to a width of the second pulse signal and comparing the second digital number from the first digital number to generate a third digital number according to an embodiment. The circuit arrangement may comprise a converter configured to convert the second pulse signal to a second digital number proportional to a width of the second pulse signal and a comparator configured to compare the second digital number from the first digital number to generate a third digital number in an embodiment. This feature may be used in combination with any of one or more features of all other described embodiments. In particular, this feature may be used in combination with any of one or more features of all other described embodiments without comprising the feature according to which each converter stage of the at least two converter stages is configured to propagate and shrink the respective pulse signal.

According to an embodiment of the described method, the described method comprises frequency dividing a clock signal and receiving the frequency divided clock signal as the first input signal. In an embodiment of the described circuit arrangement, the described circuit arrangement comprises a frequency divider configured to divide the frequency of a clock signal, wherein an output line of the frequency divider is connected to the first receiver. This may have the technical effect of reducing the power consumption because switching occurs less often. The clock signal may be a clock signal of an IC. The clock signal may be a reference clock signal.

The described method comprises forwarding the third digital number to a digitally controlled oscillator according to an embodiment of the described method. The described circuit arrangement comprises a digitally controlled oscillator configured to receive the third digital number from the adder in an embodiment of the described circuit arrangement. This may have the technical effect of enabling the energy-efficient control of a phase locked loop. The frequency of the digitally controlled oscillator may be controlled by the value of the third digital number.

According to an embodiment forwarding the third digital number to a digitally controlled oscillator comprises digitally filtering the third digital number. This may have the technical effect of improving control of the digitally controlled oscillator with a proportional-integral-derivative controller.

Digitally filtering the third digital number comprises multiplying and integrating the third digital number in parallel in an embodiment of the described method. The digital filter comprises a multiplier and an integrator arranged in parallel in an embodiment of the described circuit arrangement.

In an embodiment of the described circuit arrangement, the circuit arrangement is implemented by at least one complementary metal-oxide-semiconductor circuit.

It is to be understood that any feature presented for a particular exemplary embodiment may also be used in combination with any other described exemplary embodiment of any category.

Further, it is to be understood that the presentation of the described method and the circuit arrangement in this section is merely exemplary and non-limiting.

Other objects and features of the described method and the described circuit arrangement will become apparent from the following detailed description considered in conjunction with the accompanying drawings. It is to be understood, however, that the drawings are designed solely for purposes of illustration and not as a definition of limits of protection scope, for which reference should be made to the appended claims. It should be further understood that the drawings are not drawn to scale and that they are merely intended to conceptually illustrate the structures and procedures described herein.

BRIEF DESCRIPTION OF THE DRAWINGS

In the Figures show.

Like reference numerals in different Figures indicate like elements.

DETAILED DESCRIPTION OF THE DRAWINGS

Figure 1:
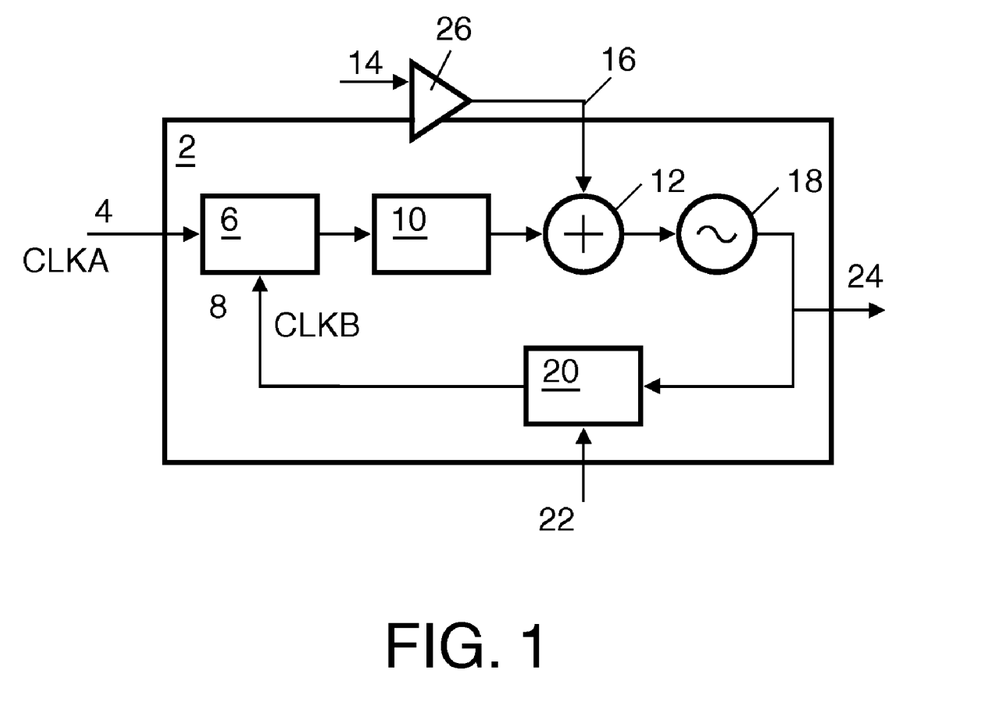
FIG. 1 is a schematic block diagram of a phase locked loop according to the prior art.

FIG. 1 is a schematic block diagram of a phase locked loop circuit 2 which is known in the prior art. The phase locked loop circuit 2 comprises a variable frequency oscillator 18, such as a voltage controlled oscillator or a digitally controlled oscillator. The variable frequency oscillator 18 provides an oscillator signal at an output 24. The output 24 is coupled to an input of a frequency divider 20 for dividing the frequency of the oscillator signal and generating an oscillator signal with a divided frequency. The division ratio of the frequency divider 20 can be varied in response to a signal provided at an input 22 of the frequency divider 20. The input 22 is thereby a first modulation point for modulating the variable frequency oscillator 18 with a modulation signal. The frequency divider 20 provides the divided and modulated oscillator signal at an output which is coupled to a second input 8 of a phase comparator 6. A first input 4 of the phase comparator 6 receives a reference signal generated by a reference oscillator (not illustrated), such as a crystal oscillator. The reference signal is herein also referred to as the first signal CLKA. The signal arriving from the frequency divider 20 at a second input 8 is herein also referred to as the second signal CLKB. The phase comparator 6 provides an error signal at an output which is coupled to an input of a filter 10. The error signal is indicative of the phase difference between the signal at the first input 4, i.e. the reference signal generated by the reference oscillator, and the signal at the second input 8, i.e. the divided and modulated oscillator signal. The output of the filter 10, which is the filtered error signal, is coupled to a first input of a summing stage 12. A second input 16 of the summing stage 12 also receives the modulation signal, and the summing stage 12 provides the sum of the filtered error signal and the modulation signal at an output which is coupled to an input of the variable frequency oscillator 18 for controlling its frequency. The second input 16 of the summing stage 12 thus provides a second modulation point for modulating the variable frequency oscillator 18. The summing stage 12 may be implemented in various ways. For example, for an analogue phase locked loop it may sum voltages, and for a digital phase locked loop it may sum digital codes. A further possibility is for the inputs of the summing stage 12 to directly drive independent varicaps, or capacitor banks, in which case the resulting sum is the sum of capacitance values.

In order to compensate for variations in the gain of the variable frequency oscillator 18, the modulation signal can be scaled by a scaling stage 26 coupled to the second input 16 of the summing stage 12. The scaling stage 26 may be, for example, a variable gain amplifier or may be implemented in a digital processor. Thus the modulation signal to be applied to the second modulation point is provided at an input 14 of the scaling stage 26, and the degree of scaling by the scaling stage 26 is determined by a scaling control signal coupled to a control input of the scaling stage 26. In FIG. 1 the scaling stage 26 is shown as separate from the phase locked loop circuit 2, but in practice it may be incorporated into the phase locked loop circuit 2.

Figure 2:
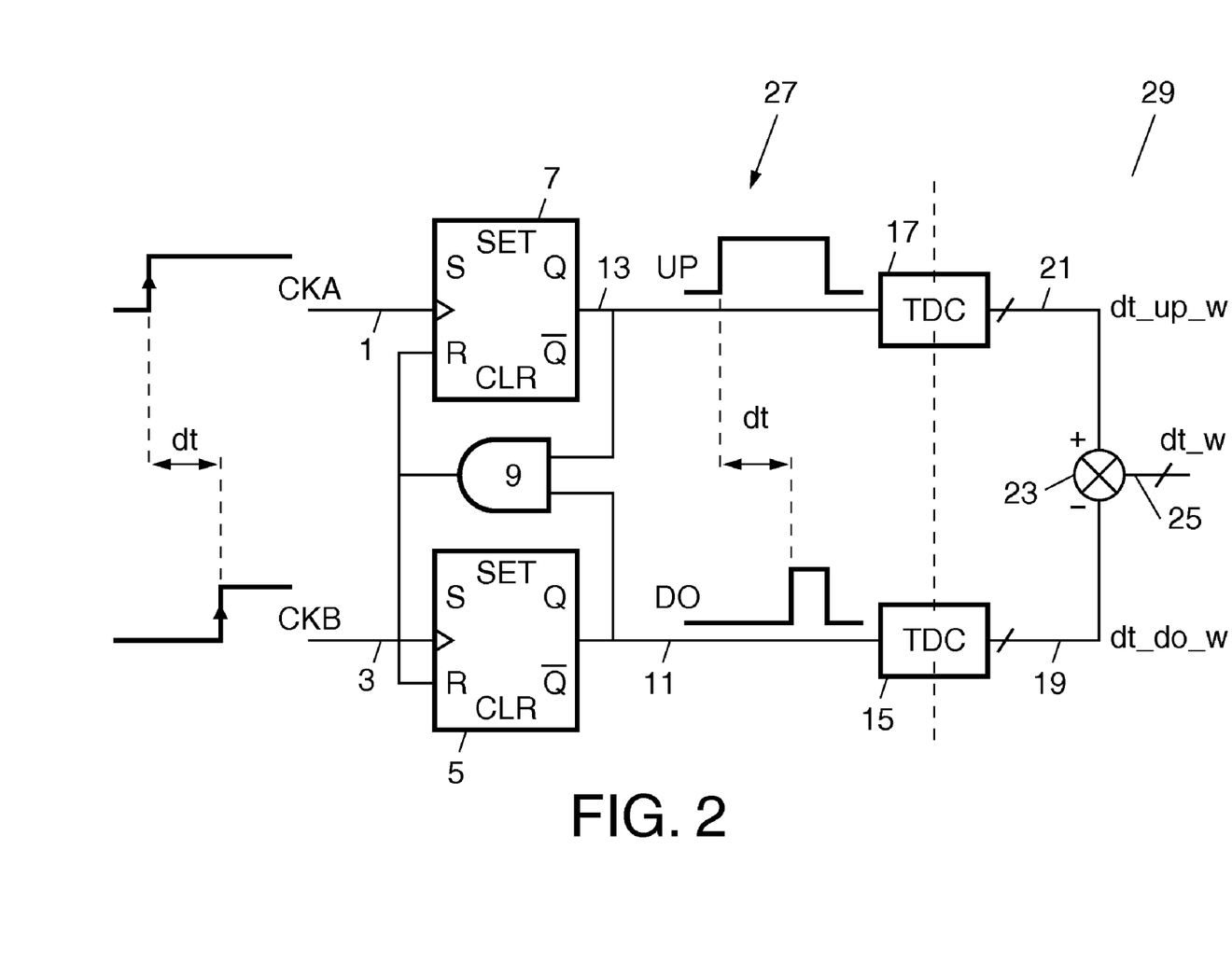
FIG. 2 is a schematic illustration of a phase frequency to digital converter.

FIG. 2 is a schematic illustration of a phase frequency to digital converter. The phase frequency to digital converter comprises an analogue section 27 and a digital portion 29. In the analogue portion 27, phase and frequency differences between a first signal CLKA received at a first input line 1 and a second signal CLKB received at a second input line 3 are converted into pulses. The first signal CLKA is the reference signal, the second signal CLKB is the signal arriving from a frequency divider in the phase locked loop (not illustrated). The first signal CLKA and the second signal CLKB usually do not arrive with exactly the same frequency and phase at the first input line 1 and the second input line 3, respectively. The frequency and phase difference are expressed in the FIG. 2 as a difference in time dt.

The transformation of the phase and frequency difference between the first and second signal CLKA, CLKB at the first input line 1 and at the second input line 3, respectively, occurs into pulses with a different width. This is achieved with a circuit comprising a first flip-flip 7 comprising a first output line 13, a second flip-flop 5 comprising a second output line 11 and an AND logic gate 9. The AND logic gate 9 ensures that if the first output line 13 and the second output line 11 have a high level signal, then the AND logic gate 9 generates a high level signal connected to the reset input lines of the first flip-flop 7 and the second flip-flop 5. Consequently, the first output line 13 and the second output line 11 are reset and any pulses output at the first output line 13 and the second output line 11 are reset. As a result, the pulses are terminated essentially simultaneously.

Moreover, the AND logic gate 9 also ensures that both the pulse at the first output line 13 and the pulse at the second output line 11 each have a minimal width corresponding to the propagation delay of the AND logic gate 9 and the time it takes the first flip-flop 7 and the second flip-flop 5 to generate a falling edge after receiving a reset signal at the reset input line of the first flop 7 and the second flip-flop 5, respectively.

The pulse at the first output line 13 is named "UP" and the pulse at the second output line 11 is named "DO". Thus the width of the pulse signal that is generated second at either the first output line 13 or at the second output line 11 corresponds to the propagation delay of the AND logic gate 9 and the propagation delay of the reset signal of either the first flip-flop 7 or the second flip-flop 5. On the other hand, the width of the pulse signal that is generated first at either the first output line 13 or at the second output line 11 corresponds to the width of the pulse signal generated second plus the difference in time dt.

After the transformation into pulses, a further conversion occurs into the digital domain. The conversion of the first pulse UP occurs independent from the conversion of the second pulse DO. The conversion of the pulse signal output at the first output line 13 occurs in a first time-to-digital converter 17. The conversion of the pulse signal output at the second output line 11 occurs in a second time-to-digital converter 15.

The transformation into the digital domain provides a first digital word dt_w_up at a first digital output line 21 and a second digital word dt_w_up at a second digital output line 19. The first digital output line 21 and the second digital output line 19 are parallel digital signal lines. A subtractor 23 subtracts the second digital word from the second digital output line 19 from the first digital word from the first digital output line 21 so as to obtain the digital output signal at, i.e. the error signal.dt_w, at the error signal output line 25.

Figure 3:
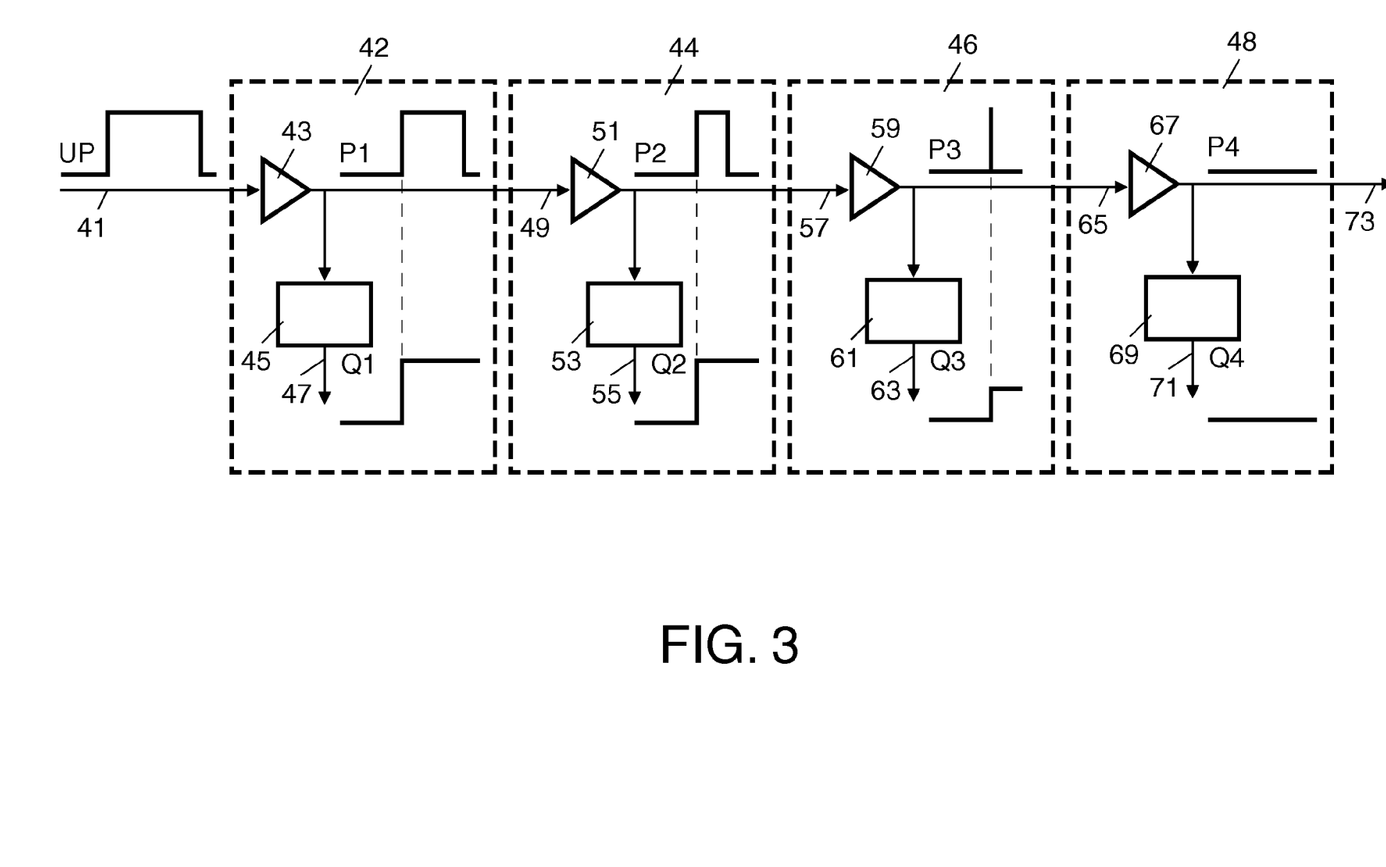
FIG. 3 is a schematic illustration of a first embodiment of a time to digital converter.

FIG. 3 is a schematic illustration of a first embodiment of a time to digital converter. The time to digital converter comprises four converter stages wherein each converter stage is a pulse shrinking stage 42, 44, 46, 48. The first pulse shrinking stage 42 comprises a first buffer circuit 43 and a first pulse detection circuit 45. The second pulse shrinking stage 44 comprises a second buffer circuit 51 and a second pulse detection circuit 53. The third pulse shrinking stage 46 comprises a third buffer circuit 59 and a third pulse detection circuit 61. The fourth pulse shrinking stage 48 comprises a fourth buffer circuit 67 and a fourth pulse detection circuit 69. The time to digital converter may comprise any number of pulse shrinking stages 42, 44, 46, 48.

A rectangular input pulse is received at a first input line 41 of the first buffer circuit 43. The first buffer circuit 43 outputs a rectangular pulse at a first output line 49 after a propagation delay. However, because the propagation delay of the rising edge of the rectangular input pulse is greater than the propagation delay of the falling edge of the rectangular input pulse, the width of the rectangular pulse output at the first output line 49 is less than the width of the rectangular input pulse received at the first input line 41. The first pulse detection circuit 45 detects the rectangular pulse output at the first output line 49 and generates a rising edge at the first pulse detection output line 47.

The rectangular pulse output at the first output line 49 is received by the second buffer circuit 51. The second buffer circuit 51 outputs a rectangular pulse at the second output line 57 after a propagation delay. Also for the second buffer circuit 51, the propagation delay of the rising edge of the rectangular input pulse is greater than the propagation delay of the falling edge of the rectangular input pulse. Consequently, the width of the rectangular pulse output at the second output line 57 is in turn less than the width of the rectangular pulse output at the first output line 49. The second pulse detection circuit 53 detects the rectangular pulse output at the second output line 57 and generates a rising edge at the second pulse detection output line 55.

The rectangular pulse output at the second output line 57 is received by the third buffer circuit 59. The third buffer circuit 59 outputs a signal at the third output line 65 after a propagation delay. Also for the third buffer circuit 59, the propagation delay of the rising edge of the rectangular input pulse is greater than the propagation delay of the falling edge of the rectangular input pulse. Because the rectangular pulse output at the second output line 57 has a small width, the rectangular pulse output at the third output line 65 has a minimal width. The third pulse detection circuit 61 detects the rectangular pulse output at the third output line 65 and generates a rising edge at the third pulse detection output line 63.

The rectangular pulse output at the third output line 65 is received by the fourth buffer circuit 67. Because the width of the rectangular pulse output at the third output line is minimal and because the propagation delay of the rising edge of the rectangular input pulse is greater than the propagation delay of the falling edge of the rectangular input pulse, the fourth buffer circuit 67 does not output a pulse signal at the fourth output line 67. The fourth pulse detection circuit 69 detects no pulse output at the fourth output line 73 and generates no signal at the fourth pulse detection output line 71.

The signals on the pulse detection output lines 47, 55, 63, 71 are processed to generate a digital number corresponding to the number of pulse detection output lines 47, 55, 63, 71 at which a rising edge has been generated. This may be done by detecting the highest order pulse detection output line at which a rising edge has been generated, because a rising edge generated at a pulse detection output line implies that at the lower order pulse detection output lines also rising edges have been generated. It is an advantageous property of the described arrangement that the activity on the pulse detection output lines 43, 51, 59, 67 is proportional to the rectangular pulse input, i.e. to the measured difference in time dt. There is no switching activity for buffer circuits 43, 51, 59, 67 and pulse detection circuits 45, 53, 61, 69 once the rectangular pulse has vanished by successive shrinking.

The time to digital converter illustrated in FIG. 3 may be used in a phase locked loop. When the phase locked loop is in a steady state, the phase error is small. The power consumed is proportional to the phase error, because the phase error is proportional to the number of pulse shrinking stages 42, 44, 46, 48 through which the rectangular pulse propagates. Thus for the prevalent situation of the phase locked loop in steady state the consumed power is small.

Figure 4:
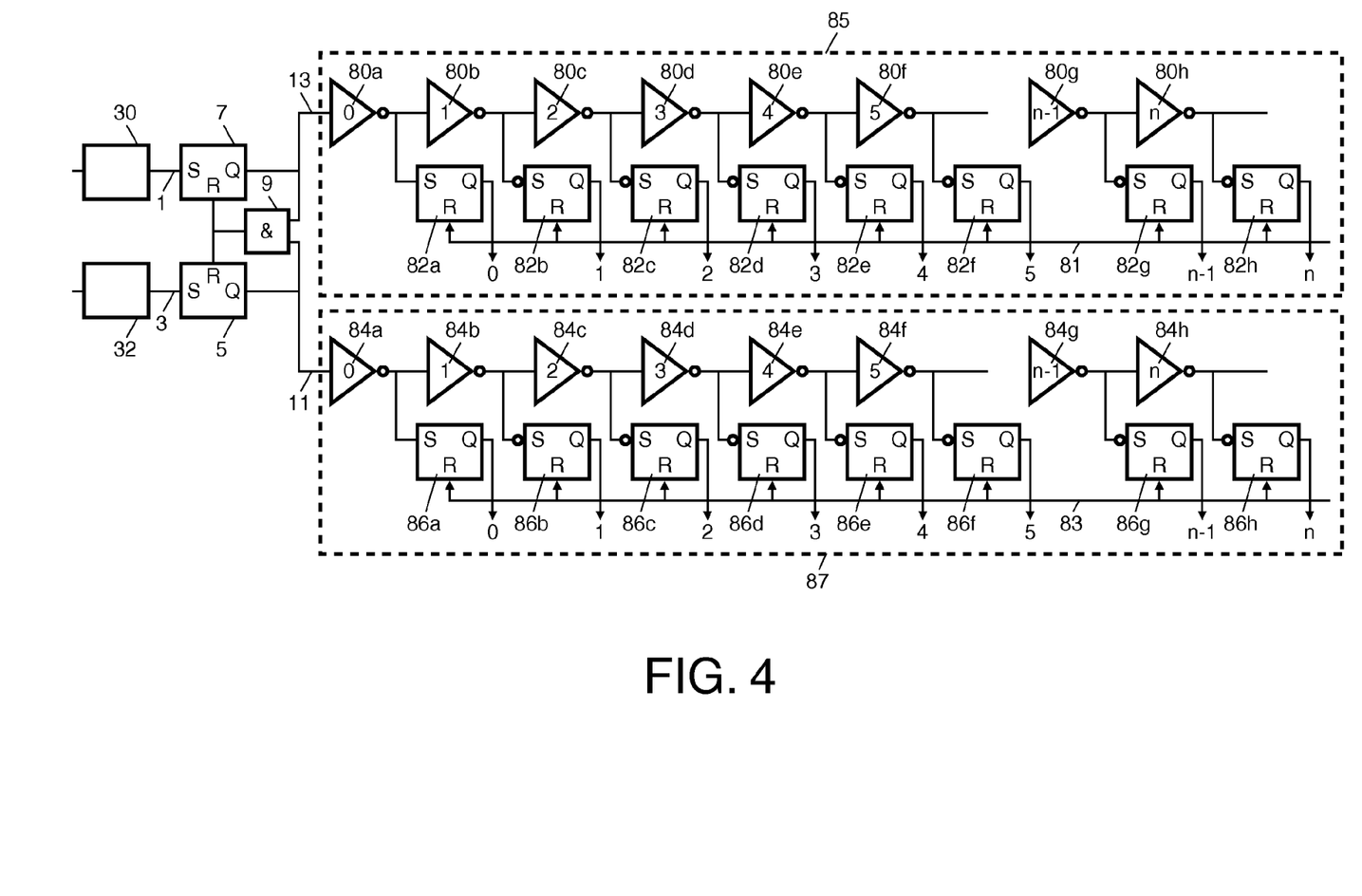
FIG. 4 is a more detailed schematic illustration of a phase frequency to digital converter according to a first embodiment of the described circuit arrangement.

FIG. 4 is a more detailed schematic illustration of a phase frequency to digital converter according to a first embodiment of the described circuit arrangement. The first input line 1 and the second input line 3 connected to the first flip-flop 7 and the second flip-flop 5, respectively, are depicted. Further depicted are the AND logic gate 9, the first output line 13 and the second output line 11. By way of example, the illustrated phase frequency to digital converter comprises a first edge detecting circuit 30 and a second edge detecting circuit 32. The first edge detecting circuit 30 and the second edge detecting circuit 32 are configured to detect a falling edge or a rising edge at their respective input line. When the first edge detecting circuit 30 detects a rising edge or a falling edge, which may not be the edge of a rectangular signal, a rectangular rising edge or a rectangular falling edge is generated at the first input line 1. Analogously, when the second edge detecting circuit 32 detects a rising edge or a falling edge, which also may not be the edge of a rectangular signal, a rectangular rising edge or a rectangular falling edge is generated at the second input line 3. The functionality of the first edge detecting circuit 30 and the second edge detecting circuit 32 may also be comprised in the first flip-flop 7 and the second flip-flop 5, respectively.

The first pulse UP is generated at the first output line 13 and the second pulse DO is generated at the second output line 11. The difference in width between the first pulse UP and the second pulse DO is proportional to the measured difference in time dt corresponding to the phase difference of the signal input at the first input line 1 and the signal input at second input line 3, respectively.

The first pulse UP generated at the first output line 13 is propagated through a first succession 85 of pulse shrinking stages, each pulse shrinking stage comprising an inverter 80a-h and a set reset latch 82a-h. The output of each inverter 80a-h is connected to the input of the next inverter 80a-h as well as to the set input line of the corresponding set reset latch 82a-h. The even numbered set reset latches 82b, 82d, 82f, 82h comprise an inverted set input line. The reset line of each set reset latch 82a-h of the first succession 85 of pulse shrinking stages is connected to a first shared reset line 81. Thus the set reset latches 82a-h of the first succession 85 of pulse shrinking stages can be reset simultaneously. The output line of each set reset latch 82a-h is a pulse detection output line of the pulse shrinking stage of the first succession 85 of pulse shrinking stages comprising the set reset latch 82a-h.

Analogously, the second pulse DO generated at the second output line 11 is propagated through a second succession 87 of pulse shrinking stages, each also comprising an inverter 84a-h and a set reset latch 86a-h. The output of each inverter 84a-h is connected to the input of the next inverter 84a-h as well as to the set input line of the corresponding set reset latch 86a-h. The even numbered set reset latches 86b, 86d, 86f, 86h comprise an inverted set input line. The reset input line of each set reset latch 86a-h of the second succession 87 of pulse shrinking latches is connected to a second shared reset line 83. Thus the set reset latches 86a-h of the second succession 85 of pulse shrinking stages can be reset simultaneously. The output line of each set reset latch 86a-h is a pulse detection output line of the pulse shrinking stage of the second succession 87 of pulse shrinking stages comprising the set reset latch 86a-h.

All components of the illustrated phase frequency to digital converter according to a first embodiment of the described circuit arrangement may be implemented using standard CMOS circuit components. Thus it is an advantage that process technology and miniaturization advances for CMOS immediately come to bear for the illustrated phase frequency to digital converter as well. Benefits to improved area density, speed, power reduction of each new technology generation may be used to full advantage.

Figure 5:
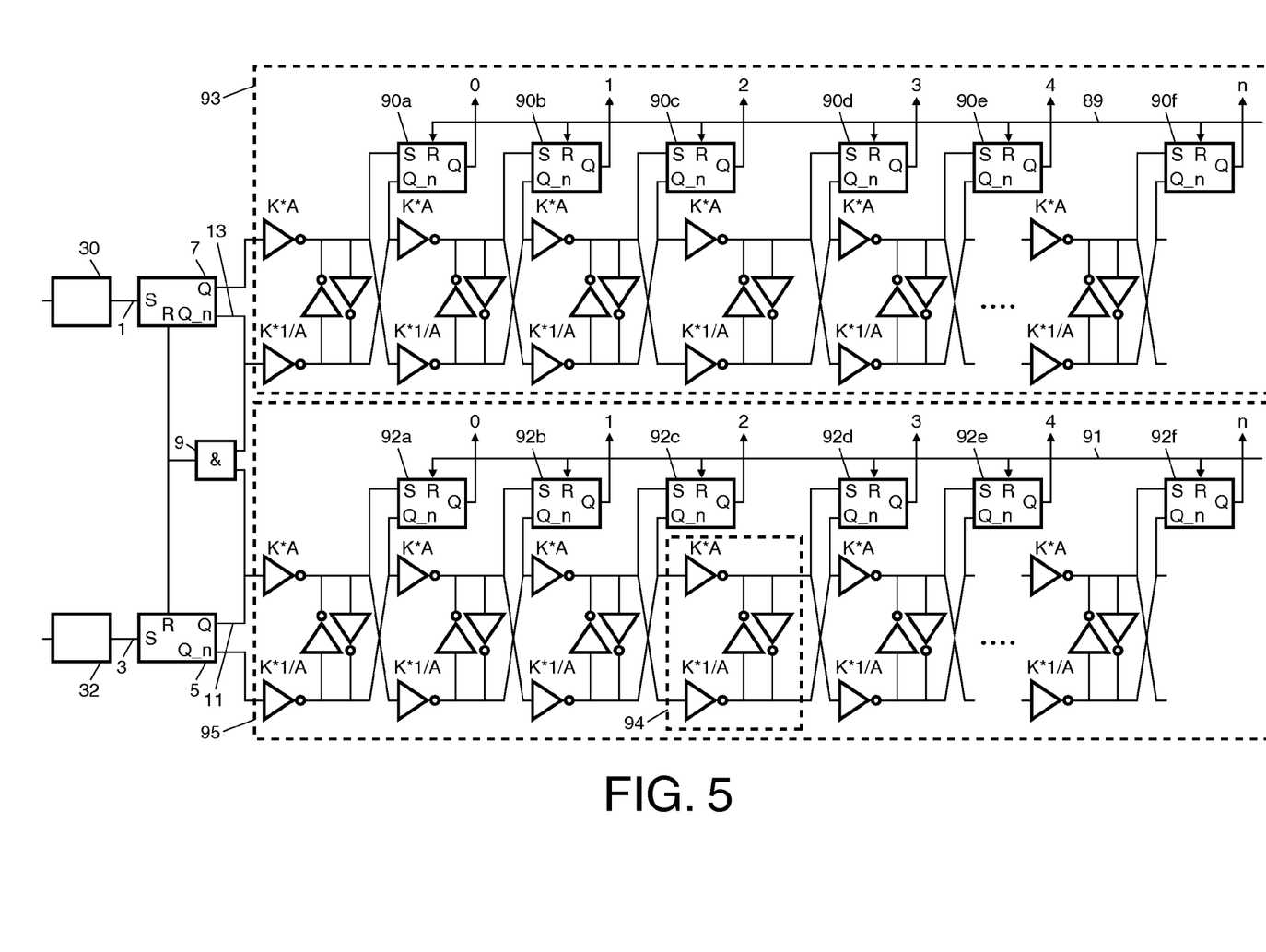
FIG. 5 is a more detailed schematic illustration of a phase frequency to digital converter according to a second embodiment of the described circuit arrangement.

FIG. 5 is a more detailed schematic illustration of a phase frequency to digital converter according to a second embodiment of the described circuit arrangement. The first input line 1 and the second input line 3 connected to the first flip-flop 7 and the second flip-flop 5, respectively, are depicted. Further depicted are the AND logic gate 9, the first output line 13 and the second output line 11. By way of example, the illustrated phase frequency to digital converter also comprises a first edge detecting circuit 30 and a second edge detecting circuit 32. The first edge detecting circuit 30 and the second edge detecting circuit 32 are configured to detect a falling edge or a rising edge at their respective input line. When the first edge detecting circuit 30 detects a rising edge or a falling edge, which may not be the edge of a rectangular signal, a rectangular rising edge or a rectangular falling edge is generated at the first input line 1. Analogously, when the second edge detecting circuit 32 detects a rising edge or a falling edge, which also may not be the edge of a rectangular signal, a rectangular rising edge or a rectangular falling edge is generated at the second input line 3. The functionality of the first edge detecting circuit 30 and the second edge detecting circuit 32 may also be comprised in the first flip-flop 7 and the second flip-flop 5, respectively.

The first pulse UP is generated at the first output line 13 and the second pulse DO is generated at the second output line 11. The difference in width between the first pulse UP and the second pulse DO is proportional the measured difference in time dt corresponding to the phase difference of the signal input at the first input line 1 and the second input line 3, respectively.

The second pulse DO generated at the second output line 11 is propagated through a second succession 95 of pulse shrinking stages, each comprising a buffering circuit and a set reset latch 92a-f. A buffering circuit 94, identical in architecture to the buffering circuit of each pulse shrinking stage, comprises a first buffer input line, a second buffer input line, a first buffer output line, a second buffer output line and four inverters. The first buffer input line is connected to the input of the first inverter. The second buffer input line is connected to the input of the second inverter. An output of the first inverter is connected to a set input of the set reset latch 92d, to the input of the third inverter and to the output of the fourth inverter. The output of the second inverter is connected to an inverted set input of the set reset latch 92d, to the input of the fourth inverter and to the output of the third inverter. Thus the third inverter and the fourth inverter form a cross-coupled inverter circuit. Further the output of the first inverter is connected to the first buffer input line of the next buffering circuit and the output of the second inverter is connected to the second buffer input line of the next buffering circuit in the second succession 95 of pulse shrinking stages.

The reset input line of each set reset latch 92a-f of the second succession 95 of pulse shrinking latches is connected to a second shared reset line 91. Thus the set reset latches 92a-f of the second succession 95 of pulse shrinking stages can be reset simultaneously. The output line of each set reset latch 92a-f is a pulse detection output line of the pulse shrinking stage of the second succession 95 of pulse shrinking stages comprising the set reset latch 92a-f.

Analogously, The first pulse UP generated at the first output line 13 is propagated through a first succession 93 of pulse shrinking stages, each comprising a buffering circuit analogously equivalent to the described buffering circuit 94 and a set reset latch 90a-f.

The reset input line of each set reset latch 90a-f of the first succession 93 of pulse shrinking stages is connected to a first shared reset line 89. Thus the set reset latches 90a-f of the first succession 93 of pulse shrinking stages can be reset simultaneously. The output line of each set reset latch 90a-f is a pulse detection output line of the pulse shrinking stage of the first succession 93 of pulse shrinking stages comprising the set reset latch 90a-f.

All components of the illustrated phase frequency to digital converter according to a second embodiment of the described circuit arrangement may also be implemented using standard CMOS circuit components. Thus it is an advantage that process technology and miniaturization advances for CMOS immediately come to bear for the illustrated phase frequency to digital converter as well. Here also the benefits to improved area density, speed, power reduction of each new technology generation may be used to full advantage.

Figure 6:
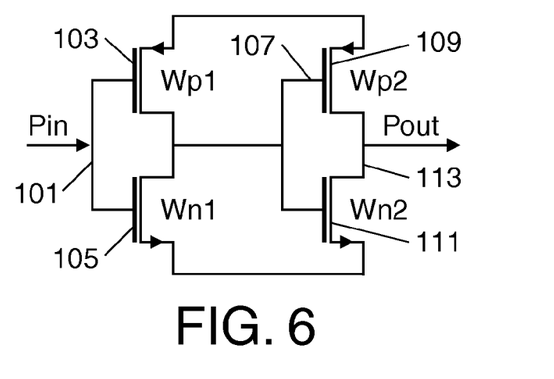
FIG. 6 is a schematic circuit diagram of a first embodiment of a buffer element of a pulse shrinking stage.

FIG. 6 is a schematic circuit diagram of a first embodiment of a buffer element of a pulse shrinking stage. An input signal line 101 is connected to the gate of a first p-channel MOSFET 103 and to the gate of a first n-channel MOSFET 105. The drain of the first p-channel MOSFET 103 is connected to the drain of the first n-channel MOSFET 105. Thus the first p-channel MOSFET 103 and the first n-channel MOSFET 105 form an inverter with output signal line 107. The intermediate output signal line 107 is connected to the gate of a second p-channel MOSFET 109 and to the gate of a second n-channel MOSFET 111. The drain of the second p-channel MOSFET 103 is connected to the drain of the second n-channel MOSFET 111 thus forming the output signal line 113 of the buffer element. The aspect ratio of a MOSFET is the ratio of the width of the channel region of the MOSFET to the length of the channel region of the MOSFET.

The aspect ratio of the first p-channel MOSFET 103 is larger than the aspect ratio of the second p-channel MOSFET 109. Also, the aspect ratio of the second n-channel MOSFET 111 is larger than the aspect ratio of the first n-channel MOSFET 105. The speed at which a signal propagates through the buffer circuit depends on the aspect ratio of the transistors being switched. Thus the propagation delay of a falling edge at the input signal line 101 depends on the aspect ratio of the first p-channel MOSFET 103 and the aspect ratio of the second n-channel MOSFET 111. Conversely, the propagation delay of a rising edge at the input signal line 101 depends on the aspect ratio of the first n-channel MOSFET 105 and the second p-channel MOSFET 109. Consequently, the propagation delay of a rising edge from the input signal line 101 to the output signal line 113 is greater than the propagation delay of a falling edge.

The propagation of a rising edge or a falling edge toggles only two nodes, namely the output signal line 113 and the intermediate output signal line 107 of the first p-channel MOSFET 103 and the first n-channel MOSFET 105 and thus reduces the power consumption of the pulse shrinking stage.

Figure 7:
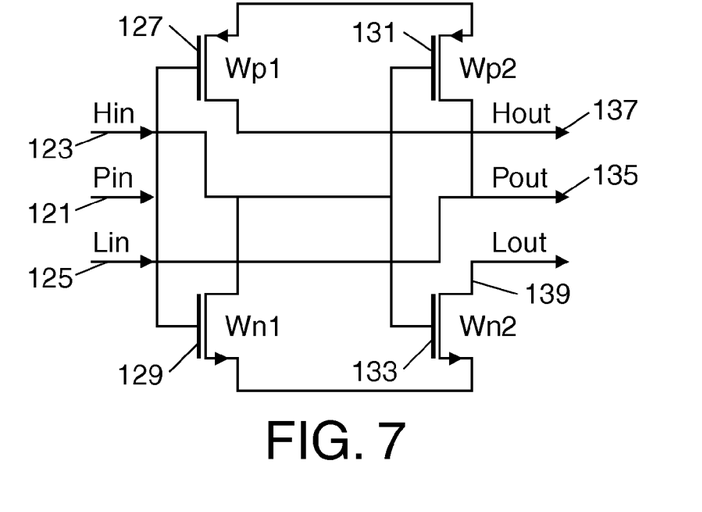
FIG. 7 is a schematic circuit diagram of a second embodiment of a buffer element of a pulse shrinking stage.

FIG. 7 is a schematic circuit diagram of a second embodiment of a buffer element of a pulse shrinking stage. A signal input line 121 is connected to the gate of a first p-channel MOSFET 127 and to the gate of a first n-channel MOSFET 129. A high feed-forward signal input line is connected to the drain of the first n-channel MOSFET 129 as well as to the gate of a second p-channel MOSFET 131 and the gate of a second n-channel MOSFET 133. A low feed-forward signal input line 125 is connected to the drain of the second p-channel MOSFET 131 and a signal output line 135. The drain of the first p-channel MOSFET 127 is connected to a high feed-forward signal output line 137. The drain of the second n-channel MOSFET 133 is connected to a low feed-forward signal output line 139.

The signal output line 135 is connected to the signal input line of the buffer element of a following pulse shrinking stage. Similarly, the high feed-forward signal output line 137 and the low feed-forward signal output line 139 is connected to the high feed-forward signal input line and a low feed-forward signal input line of the buffer element of a following pulse shrinking stage, respectively.

A rising edge at the signal input line 121 is propagated by turning the first n-channel MOSFET 129 on. Once the first n-channel MOSFET 129 has been switched, the second p-channel MOSFET 131 is turned on. Once the second p-channel MOSFET 131 has switched, a rising edge appears at the signal output line 135. The high feed-forward signal output line 137 as well as the low feed-forward signal output line 139 remain floating. Thus a rising edge has a propagation delay determined by the added switching time of an n-channel MOSFET 129 and the switching time of a p-channel MOSFET 131.

A falling edge at the signal input line 121, on the other hand, is propagated by turning the first p-channel MOSFET 127 on. Once the first p-channel MOSFET 127 has switched, a rising edge appears at the high feed-forward signal output line 137. Thus a falling edge at the signal input line 121 has a propagation delay with regard to a rising edge at the high feed-forward signal output line 137 of the switching time of a single p-channel MOSFET 131.

Further, a rising edge at the high feed-forward signal input line 123 is propagated by turning on the second n-channel MOSFET 133. Once the second n-channel MOSFET 133 has switched, a falling edge appears at the low feed-forward signal output line 139. Thus a rising edge at the high feed-forward signal input line 123 has a propagation delay with regard to a falling edge at the low feed-forward signal output line 139 of the switching time of a single n-channel MOSFET 133.

Moreover, a falling edge at the low feed-forward signal input line 125 is propagated directly to the signal output line 135 because the low feed-forward signal input line 125 is directly connected to the signal output line 135.

It follows that for a rising edge at the signal input line 121, the rising edge is successively propagated to the signal output line 135 of each subsequent buffer element with a propagation delay of the switching time of a p-channel MOSFET 127 plus the switching time of an n-channel MOSFET 133 for each buffer element. For a falling edge at the signal input line 121, however, alternately either a rising edge is propagated to the high feed-forward signal output line 137 with a propagation delay of the switching time of a p-channel MOSFET 127 or a falling edge is propagated to the low feed-forward signal output line 139 without any transistor switching time contributing to the propagation delay.

Consequently, a falling edge is propagated faster than a rising edge though the pulse shrinking stage comprising a cascade of buffer elements resulting in the desired pulse shrinking property. It is to be noted that the described second embodiment of a buffer element of a pulse shrinking stage can be implemented with standard n-channel MOSFETs and p-channel MOSFETs also used for CMOS circuits because the aspect ratio of the n-channel MOSFETs and p-channel MOSFETs does not need to be adjusted. Thus this embodiment of the buffer element is particularly suitable for automatic synthesizing reducing the need for manual transistor layout. The shrinking capability of the buffer element illustrated in FIG. 7 can take full advantage of CMOS shrinking possibilities. And also other CMOS technology benefits may be used to full advantage.

Figure 8:
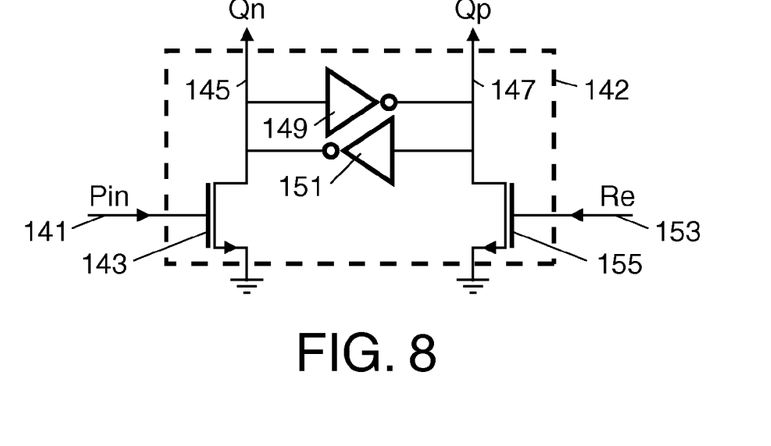
FIG. 8 is a schematic circuit diagram of an embodiment of a pulse detection circuit.

FIG. 8 is a schematic circuit diagram of an exemplary embodiment of a pulse detection circuit. The pulse detection circuit comprises a latch 142, which latch 142 comprises a first n-channel MOSFET 143, a second n-channel MOSFET 155, a first inverter 149 and a second inverter 151.

An input line 141 of the pulse detection circuit is connected to the gate of the first n-channel MOSFET 143. The drain of the first n-channel MOSFET 143 is connected to the complementary output line 145 of the pulse detection circuit and to the input of the first inverter 149. The output of the first inverter 149 is connected to the output line 147 of the pulse detection circuit and to the input of the second inverter 151. The output of the second inverter 151 is also connected to the complementary output line 145 of the pulse detection circuit. A reset line 153 of the pulse detection circuit is connected to the gate of the second n-channel MOSFET 155. The drain of the second n-channel MOSFET 155 is also connected to the output line 147 of the pulse detection circuit.

Before a pulse detection measurement, the output line 147 is at a low level and the complementary output line 145 is at a high level corresponding to a state indicative of "no pulse detected".

A rising edge at the input line 141 causes the first n-channel MOSFET 143 to turn on, resulting in a falling edge at the complementary output line 145 of the pulse detection circuit. This in turn causes the first inverter 149 to switch and to generate a rising edge at the output line 147 of the pulse detection circuit. Further, the second inverter 151 switches and keeps the complementary output line 145 at a high level even after the first n-channel MOSFET 143 is turned off after a falling edge at the input line 141.

The pulse detection circuit remains in this state until a rising edge is received at the reset line 153, which causes the second n-channel MOSFET 155 to turn on, resulting in a falling edge at the output line 147 of the pulse detection circuit. This in turn causes the second inverter 151 to switch and to generate a rising edge at the complementary output line 145 of the pulse detection circuit. Further, the first inverter 149 switches and keeps the output line at a low level even after the second n-channel MOSFET 155 is turned off after a falling edge at the reset line 153.

If no rising edge is received at the input line 141 no pulse is detected and no toggling of any node in the pulse detection circuit illustrated in FIG. 8 occurs.

Thus the pulse detection circuit remains in this state until a new rising edge is received at the input line 141. The pulse detection circuit can be implemented with standard MOSFET transistors also used for CMOS circuits. In particular, the pulse detection circuit may be implemented with four n-channel MOSFET transistors and two p-channel MOSFET transistors forming the two inverters 149, 151 and the first n-channel MOSFET 143 transistor and the second n-channel MOSFET 155 transistor. A pulse detected by the pulse detection circuit results in the toggling of just two nodes of the pulse detection circuit, namely of the output line 147 and of the complementary output line 145. Also in this case the benefits of new generation CMOS technology may be used to full advantage.

Figure 9:
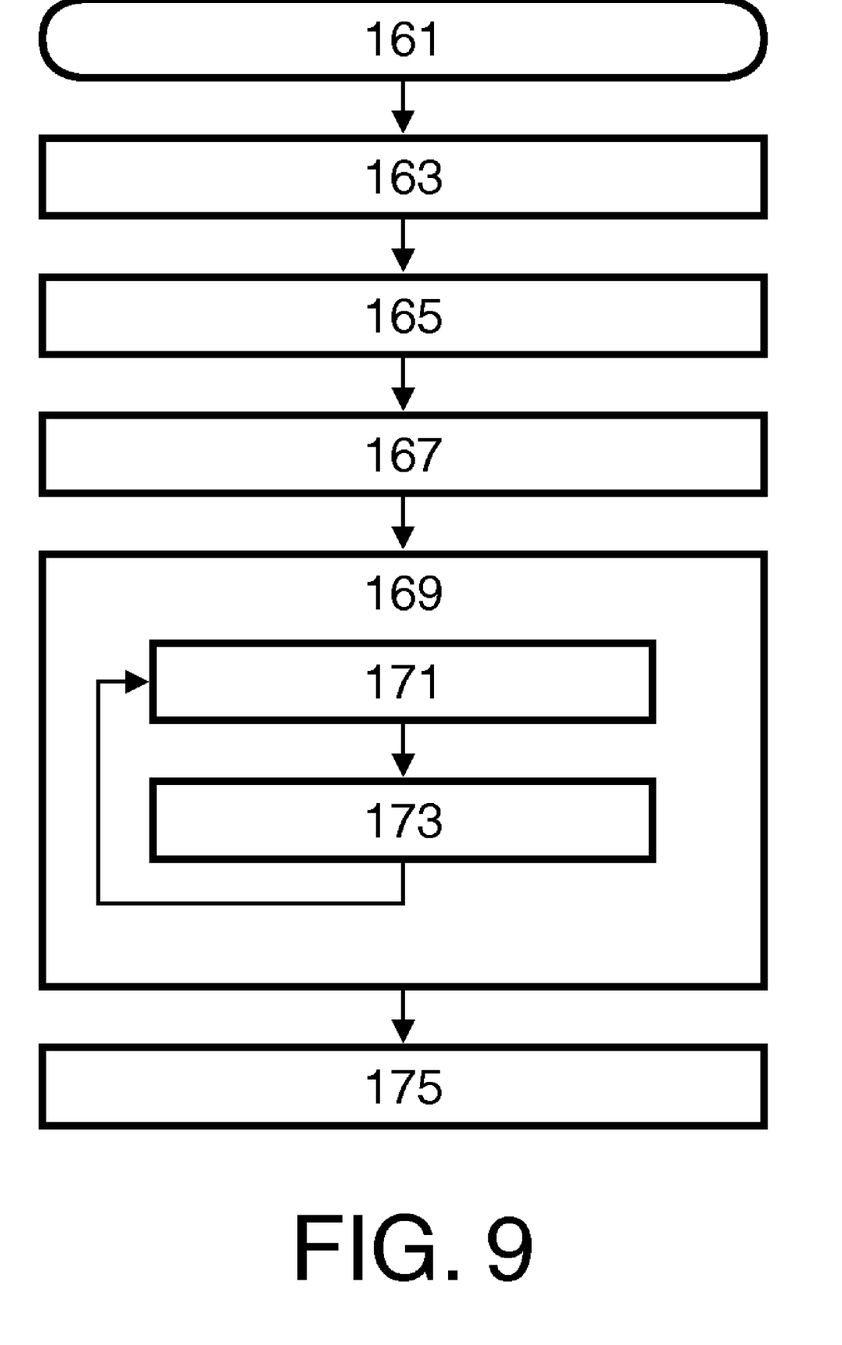
FIG. 9 is a schematic illustration of the method steps of an embodiment of the described method.

FIG. 9 is a schematic illustration of the method steps of an embodiment of the described method. A first step 161 comprises receiving a first input signal. The received first input signal comprises a rising edge.

A second step 163 comprises receiving a second input signal. The received second input signal also comprises a rising edge. The second input signal is received with a time difference dt indicative of a phase difference between the first input signal and the second input signal.

A third step 165 comprises generating a first pulse signal. The generated first pulse signal also comprises a rising edge.

A fourth step 167 comprises generating a second pulse signal. The generated second pulse signal also comprises a rising edge. The second pulse signal is also generated with a time difference dt between the rising edge of the first pulse signal and the rising edge of the second pulse signal. After the rising edge of the second pulse signal is generated, both the first pulse signal and the second pulse signal are reset. Thus the first pulse signal and the second pulse signal are reset with a falling edge. The falling edge of the first pulse signal and the second pulse signal occurs essentially simultaneously. Thus the first pulse signal and the second pulse signal are rectangular pulse signals with their respective rising edge having a time difference dt.

A fifth step 169 comprises converting the first pulse signal to a first digital number. Converting the first pulse signal to a first digital number comprises in a first substep 171 propagating and shrinking the first pulse signal and in a second substep 173 detecting the propagated pulse signal. The first substep 171 and the second substep 173 are successively repeated as many times as needed for the resolution and operating range of the phase frequency to digital converter.

A sixth step 175 comprises converting the second pulse signal to a second digital number.

The described circuit arrangement has the advantage that the power consumption is proportional to the phase difference, which means that the power consumption is reduced when the phase error is small, which corresponds to the steady state of the phase locked loop. The generated pulses have a minimum width thus preventing effects caused by transient glitches. The described circuit arrangement may be implemented with standard CMOS circuit elements and in fact with CMOS circuit elements that do not need manual adjustment. Consequently design, process, miniaturization and other advances in technology are immediately applicable to the described circuit arrangement. Only two nodes per buffer stage and two nodes per pulse detection circuit toggle even when a pulse is detected. The described circuit arrangement has inherent frequency and phase detection, which provides infinite capture range without the need for additional acquisition circuits. Phase comparison may be done with the clock signal originating from the frequency divider and not directly from an oscillator further reducing power consumption.

Furthermore, it is readily clear for a person skilled in the art that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. A circuit arrangement comprising:
    a first receiver configured to receive a first input signal,
    a second receiver configured to receive a second input signal,
    a first signal generator configured to generate a first pulse signal,
    a second signal generator configured to generate a second pulse signal, wherein a delay between a rising edge of the first pulse signal and a rising edge of the second pulse signal is proportional to one of a phase difference and a frequency difference between the first input signal and the second input signal,
    a first converter configured to convert the first pulse signal to a first digital number proportional to a width of the first pulse signal, and
    a second converter configured to convert the second pulse signal to a second digital number proportional to a width of the second pulse signal,
    wherein at least one of the first converter and the second converter comprises a cascade of at least two converter stages, wherein each converter stage of the at least two converter stages is configured to propagate and shrink the respective pulse signal.

2. Circuit arrangement according to claim 1, wherein each converter stage of the at least two converter stages comprises:
    a delay circuit configured to propagate an input pulse signal after a propagation delay,
    a detector configured to detected a propagated pulse signal, and
    a generator configured to generate a pulse detection signal when the propagated pulse signal is detected, which pulse detection signal is indicative of the respective digital number.

3. Circuit arrangement according to claim 2, wherein the delay circuit is
    configured to propagate an input pulse signal with a falling edge after a first propagation delay, and
    configured to propagate an input pulse signal with a rising edge after a second propagation delay, wherein the first propagation delay is shorter than the second propagation delay.

4. Circuit arrangement according to claim 3, wherein the delay circuit comprises:
    a first at least one transistor configured to be switched for propagating the input pulse signal with a falling edge,
    a second at least one transistor of the same type as the first at least one transistor configured to be switched for propagating the input pulse signal with a rising edge,
    wherein an aspect ratio of the first at least one transistor is greater than an aspect ratio of the second at least one transistor.

5. Circuit arrangement according to claim 3, wherein the delay circuit comprises:
    a first number of transistors configured to be successively switched and configured for generating at least one feed-forward signal for propagating the input pulse signal with a falling edge,
    a second number of transistors configured to be successively switched and configured for propagating the input pulse signal with a rising edge.

6. Circuit arrangement according to claim 2, wherein the delay circuit is configured to receive a propagated signal and configured to receive at least one feed forward signal.

7. Circuit arrangement according to claim 2, wherein the detector comprises a latch and wherein the detector is configured to reset the latch and configured to switch the latch to a state indicative of a detected pulse when the propagated pulse signal is detected.

8. Circuit arrangement according to claim 7 wherein the detector is configured to keep a state of the latch when the propagated pulse signal is not detected after resetting the latch.

9. Circuit arrangement according to claim 1, further comprising:
    a resetting circuit configured to reset the first pulse signal and configured to reset the second pulse signal after a delay after the first generator has generated the first pulse signal and the second generator has generated the second pulse signal,
    wherein the first generator is configured to generate the first pulse signal when the first receiver receives a rising edge of the first input signal, and
    wherein the second generator is configured to generate the second pulse signal when the second receiver receives a rising edge of the second input signal.

10. Circuit arrangement according to claim 1, further comprising an adder configured to subtract the second digital number from the first digital number to generate a third digital number.

11. Circuit arrangement according to claim 10 comprising a digitally controlled oscillator configured to receive the third digital number from the adder.

12. Circuit arrangement according to claim 1, further comprising a frequency divider configured to divide a frequency of a clock signal, wherein an output line of the frequency divider is connected to the first receiver.

13. Circuit arrangement according to claim 1 implemented by at least one complementary metal-oxide-semiconductor circuit.

14. A method comprising:
    receiving a first input signal,
    receiving a second input signal,
    generating a first pulse signal,
    generating a second pulse signal, wherein a delay between a rising edge of the first pulse signal and a rising edge of the second pulse signal is proportional to one of a phase difference and a frequency difference between the first input signal and the second input signal,
    converting the first pulse signal to a first digital number proportional to a width of the first pulse signal, and
    converting the second pulse signal to a second digital number proportional to a width of the second pulse signal,
    wherein converting at least one of the first pulse signal and the second pulse signal to a respective digital number comprises successively propagating and shrinking the respective pulse signal.

* * * * *